(12) United States Patent
Archibald et al.

(10) Patent No.: US 9,104,405 B2
(45) Date of Patent: *Aug. 11, 2015

(54) MANAGING SERVER POWER CONSUMPTION IN A DATA CENTER

(71) Applicant: INTERNATIONAL BUSINESS MACHINES CORPORATION, Armonk, NY (US)

(72) Inventors: Matthew R. Archibald, Morrisville, NC (US); Edward L. Blackwell, Rochester, MN (US); Jerrod K. Buterbaugh, Wake Forest, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 75 days.

This patent is subject to a terminal disclaimer.

(21) Appl. No.: 13/783,852

(22) Filed: Mar. 4, 2013

(65) Prior Publication Data

US 2013/0191664 A1 Jul. 25, 2013

Related U.S. Application Data

(63) Continuation of application No. 12/868,284, filed on Aug. 25, 2010, now Pat. No. 8,464,080.

(51) Int. Cl.
*G06F 1/26* (2006.01)
*G06F 1/32* (2006.01)
(Continued)

(52) U.S. Cl.
CPC .. *G06F 1/32* (2013.01); *G06F 1/26* (2013.01); *H05K 7/1492* (2013.01); *H05K 7/20836* (2013.01)

(58) Field of Classification Search
CPC ............ G06F 1/26; G06F 1/3203; H02J 3/14; Y02B 70/3225
USPC .................................................. 713/300–340
See application file for complete search history.

(56) References Cited

U.S. PATENT DOCUMENTS 5,719,800 A 2/1998 Mittal et al.
5,861,684 A 1/1999 Slade et al.
(Continued)

OTHER PUBLICATIONS

Office Action, U.S. Appl. No. 12/868,284, Aug. 28, 2012.
(Continued)

*Primary Examiner* — Brian Misiura
(74) *Attorney, Agent, or Firm* — Edward J. Lenart; Katherine S. Brown; Kennedy Lenart Spraggins LLP

(57) ABSTRACT

Methods, system, and computer program products are provided for managing server power consumption in a data center. Embodiments include detecting, by a circuit monitoring interposer, a type of a power circuit that is currently coupled to the circuit monitoring interposer; determining a power capacity of the power circuit based on the type of the power circuit; receiving, by the circuit monitoring interposer, a power consumption server measurement from each server monitoring interposer of a plurality of server monitoring interposers, each power consumption server measurement corresponding to a server of the plurality of servers; determining a total power consumption of the power circuit in dependence upon a total of the power consumption server measurements; and determining whether the total power consumption exceeds the power capacity, and if the total power consumption of the power circuit exceeds the power capacity, instructing one or more servers to reduce their power consumption.

20 Claims, 5 Drawing Sheets

(51) Int. Cl.
*H05K 7/14* (2006.01)
*H05K 7/20* (2006.01)

(56) References Cited

U.S. PATENT DOCUMENTS

| | | |
|---|---|---|
| 6,968,465 B2 | 11/2005 | Freevol et al. |
| 7,069,463 B2 | 6/2006 | Oh |
| 7,112,131 B2 | 9/2006 | Rasmussen et al. |
| 7,135,956 B2 | 11/2006 | Bartone et al. |
| 7,171,461 B2 | 1/2007 | Ewing et al. |
| 7,240,225 B2 | 7/2007 | Brewer et al. |
| 7,269,753 B2 | 9/2007 | Farkas et al. |
| 7,444,526 B2 | 10/2008 | Felter et al. |
| 7,581,130 B2 | 8/2009 | Carroll et al. |
| 7,619,868 B2 | 11/2009 | Spitaels et al. |
| 7,827,421 B2 | 11/2010 | Brewer et al. |
| 2003/0056125 A1 | 3/2003 | O'Conner et al. |
| 2003/0085624 A1 | 5/2003 | Kadoi et al. |
| 2004/0148060 A1 | 7/2004 | Lee |
| 2004/0177283 A1 | 9/2004 | Madany et al. |
| 2005/0075839 A1 | 4/2005 | Rotheroe |
| 2005/0086544 A1 | 4/2005 | Egan et al. |
| 2005/0102544 A1 | 5/2005 | Brewer et al. |
| 2005/0138438 A1 | 6/2005 | Bodas |
| 2006/0044117 A1 | 3/2006 | Farkas et al. |
| 2006/0253715 A1 | 11/2006 | Ghiasi et al. |
| 2007/0271477 A1 | 11/2007 | Brewer et al. |
| 2008/0028246 A1 | 1/2008 | Witham |
| 2008/0178029 A1 | 7/2008 | McGrane et al. |
| 2008/0301279 A1 | 12/2008 | Brey et al. |
| 2009/0070611 A1 | 3/2009 | Bower et al. |
| 2009/0089595 A1 | 4/2009 | Brey et al. |
| 2009/0132842 A1 | 5/2009 | Brey et al. |
| 2009/0167494 A1 | 7/2009 | Martins |
| 2009/0177906 A1 | 7/2009 | Paniagua, Jr. et al. |
| 2009/0217073 A1 | 8/2009 | Brech et al. |
| 2009/0219145 A1 | 9/2009 | Wong et al. |
| 2009/0234512 A1 | 9/2009 | Ewing et al. |
| 2009/0282274 A1 | 11/2009 | Langgood et al. |
| 2010/0198535 A1 | 8/2010 | Brown et al. |
| 2011/0072289 A1 | 3/2011 | Kato |
| 2012/0054512 A1 | 3/2012 | Archibald et al. |

OTHER PUBLICATIONS

Notice of Allowance, U.S. Appl. No. 12/868,284, Jan. 30, 2013.

MANAGING SERVER POWER CONSUMPTION IN A DATA CENTER

CROSS-REFERENCE TO RELATED APPLICATION

This application is a continuation application of and claims priority from U.S. patent application Ser. No. 12/868,284, filed on Aug. 25, 2010.

BACKGROUND OF THE INVENTION

1. Field of the Invention

The field of the invention is data processing, or, more specifically, methods, apparatus, and products for managing server power consumption in a data center.

2. Description of Related Art

Conventional data centers typically include many servers and all of those servers consume power. Because power is a significant expense, managing power is an important consideration for systems administrators of data centers. Another important consideration for systems administrators of data centers is that often current safety regulations preclude configuring the servers of the data center such that the total maximum power consumption may exceed the input circuit power available. Under such safety regulations it is not possible to oversubscribe the circuit power by configuring a number of servers such that the total power consumption may be greater than the power capacity of the circuit. There is therefore an ongoing need for improvement in managing server power consumption in a data center.

SUMMARY OF THE INVENTION

Methods, system, and computer program products are provided for managing server power consumption in a data center. Embodiments include detecting, by a circuit monitoring interposer, a type of a power circuit that is currently coupled to the circuit monitoring interposer; determining a power capacity of the power circuit based on the type of the power circuit; receiving, by the circuit monitoring interposer, a power consumption server measurement from each server monitoring interposer of a plurality of server monitoring interposers, each power consumption server measurement corresponding to a server of the plurality of servers; determining a total power consumption of the power circuit in dependence upon a total of the power consumption server measurements; determining whether the total power consumption exceeds the power capacity, and if the total power consumption of the power circuit exceeds the power capacity, instructing one or more servers to reduce their power consumption.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
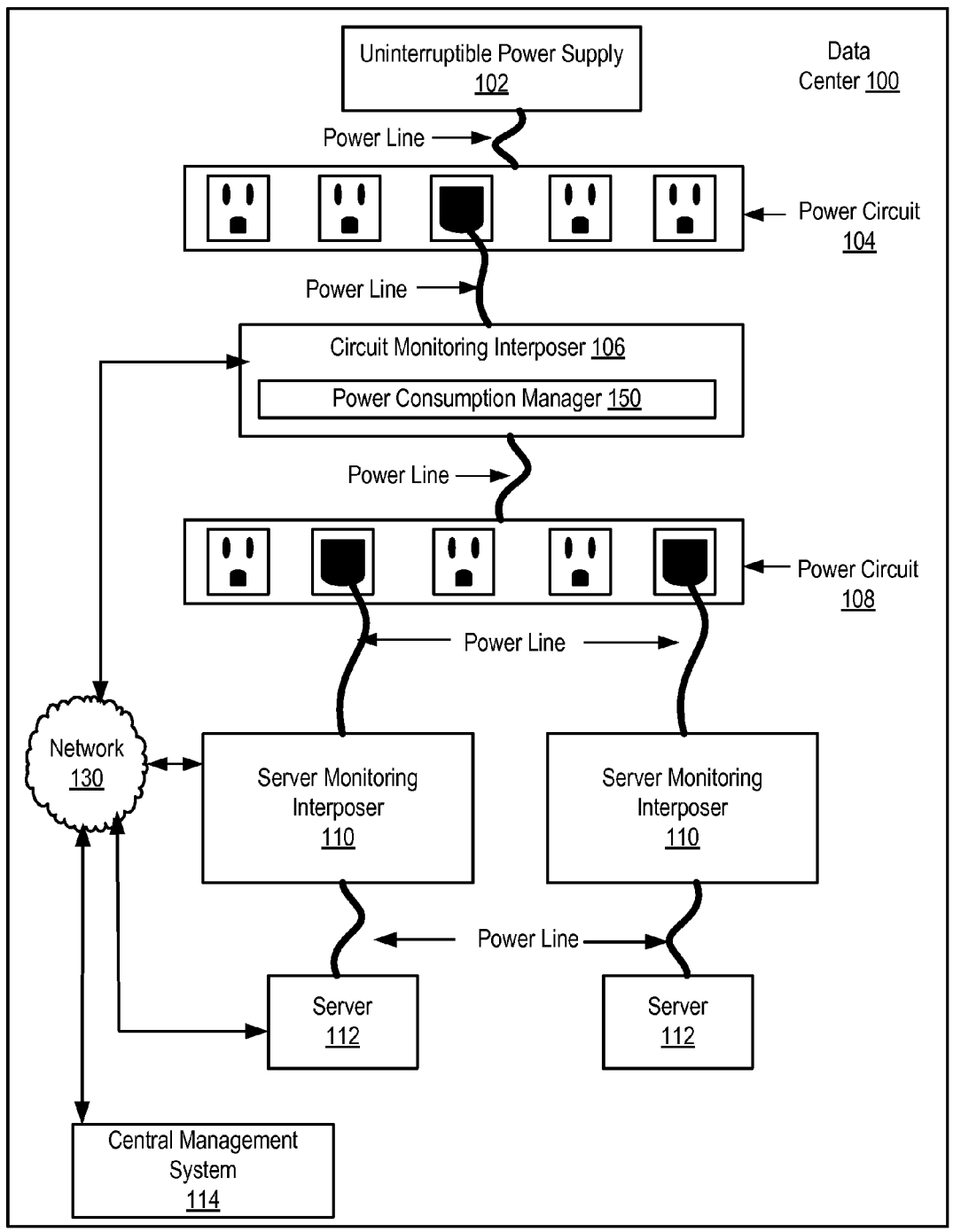
FIG. 1 sets forth a network diagram of a system for managing server power consumption in a data center according to embodiments of the present invention.

Exemplary methods, systems, and products for managing server power consumption in a data center in accordance with the present invention are described with reference to the accompanying drawings, beginning with FIG. 1. FIG. 1 sets forth a network diagram of a system for managing server power consumption in a data center according to embodiments of the present invention. The system of FIG. 1 includes a data center (100). A data center is a centralized repository, either physical or virtual, for the storage, management, and dissemination of data and information typically organized around a particular subject or pertaining to a particular business. A data center may exist within an organization's facilities or may be maintained as a specialized facility. Data centers vary in size from buildings of servers to server rooms to even computer closets.

The data center (100) of FIG. 1 includes a plurality of servers (112) that are connected to an uninterruptible power supply (102) through a power circuit (108). An uninterruptible power supply is a device or system that continuously supplies electrical or other types of energy. The power circuit (108) of FIG. 1 may be power distribution unit (PDU), such as an inter-rack power PDU or a raised floor PDU. A power distribution unit is a device that distributes electric power. Large industrial power distribution units are used for taking high voltage and current and reducing it to more common and useful levels, for example from 240V 30A single phase to multiple 120V 15A or 120V 20A plugs. A power distribution unit may have features like remote power monitoring, control down to the individual plug level, environmental monitoring, or a webcam USB port.

Each server (112) of FIG. 1 is connected to a server monitoring interposer (110) that is coupled to a power line of the server (112) which is plugged into the power circuit (108). The server monitoring interposer (110) of FIG. 1 is a device that provides an electrical contact between the power circuit (108) and one of the servers (112). Each server monitoring interposer (110) of FIG. 1 is capable of calculating a power consumption measurement (114) of a server (112) and providing the power consumption measurement (114) to the circuit monitoring interposer (106). The server monitoring interposer (110) of FIG. 1 may include circuit logic for carrying out the calculation of the power consumption measurements (114) or the calculations may be carried out in a software module in RAM within the server monitoring interposer (110).

The circuit monitoring interposer (106) of FIG. 1 is coupled to a power line of the power circuit (108) that is coupled to the power circuit (104). The circuit monitoring interposer (106) of FIG. 1 is a device that provides an electrical contact between the power circuit (108) and the uninterruptible power supply (102). The circuit monitoring interposer (106) has installed upon it a power consumption manager (150) for managing the power consumption of the servers (112) in the data center (100). The power consumption manager (150) includes computer program instructions that are capable of: detecting a type of the power circuit (108) that is currently coupled to the circuit monitoring interposer (106); determining a power capacity of the power circuit (108) based on the type of the power circuit (108); receiving a power consumption server measurement from each server monitoring interposer (110) of a plurality of server monitoring interposers, each power consumption server measurement corresponding to a server (112) of the plurality of servers; determining a total power consumption of the power circuit (108) in dependence upon a total of the power consumption server measurements (114) received from the server monitoring interposers (110) coupled to the power circuit (108); and determining whether the total power consumption of the power circuit (108) exceeds the power capacity, and if the total power consumption of the power circuit (108) exceeds power capacity, instructing one or more servers (112) to reduce their power consumption. By reducing the power consumption of one or more servers, the circuit monitoring interposer (106) is able to prevent the servers (112) from exceeding the power capacity of the power circuit (108) and thus prevent power supply problems within the data center (100) and reduce the workload of a system administrator at the data center (100).

The power consumption manager (150) of FIG. 1 may also include computer program instructions capable of detecting an actual plug receptacle type of the power circuit (108); selecting a particular server (112) to reduce power consumption in dependence upon the power consumption server measurement (114) of the particular server (112); instructing one or more servers (112) to throttle-down a CPU of the one or more servers (112); instructing one or more servers (112) to shut down a fan within the one or more servers (112); or instructing one or more servers (112) to reassign a processor job to another server; instructing one or more servers (112) to shut down.

In an alternative embodiment, power consumption management of the servers (112) is further controlled at a central management system (114). The central management system (114) of FIG. 1 may be configured to receive the information that is detected, received, monitored, measured, or determined at either of the circuit monitoring interposer (106) and the server monitoring interposer (110). In such embodiments, the central management system (114) of FIG. 1 instructs the servers (112) to reduce their power consumption. Communication between the circuit monitoring interposer (106), the server monitoring interposers (110), the servers (112), and the central management system (114) of FIG. 1 may be facilitated through a local area network (130).

The arrangement of servers and other devices making up the exemplary system illustrated in FIG. 1 are for explanation, not for limitation. Data processing systems useful according to various embodiments of the present invention may include additional servers, routers, other devices, and peer-to-peer architectures, not shown in FIG. 1, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art.

Various embodiments of the present invention may be implemented on a variety of hardware platforms in addition to those illustrated in FIG. 1.

Managing server power consumption in a data center in accordance with the present invention is generally implemented with computers, that is, with automated computing machinery. For further explanation, therefore, FIG. 2 sets forth a block diagram of automated computing machinery comprising an exemplary circuit monitoring interposer (106) useful in managing power consumption of servers (112) in a data center according to embodiments of the present invention. The circuit monitoring interposer (106) of FIG. 2 includes at least one computer processor (156) or 'CPU' as well as random access memory (168) ('RAM') which is connected through a high speed memory bus (166) and bus adapter (158) to the processor (156) and to other components of the circuit monitoring interposer (106).

Stored in RAM (168) is a power consumption manager (150) that includes computer program instructions for managing server power consumption in a data center in accordance with embodiments of the present invention. The power consumption manager (150) includes computer program instructions that when executed by the processor (156), cause the circuit monitoring interposer (106) to detect a type of the power circuit (108) that is currently coupled to the circuit monitoring interposer (106); determine a power capacity of the power circuit (108) based on the type of the power circuit (108); receive a power consumption server measurement from each server monitoring interposer (110) of a plurality of server monitoring interposers, each power consumption server measurement corresponding to a server (112) of the plurality of servers; determine a total power consumption of the power circuit (108) in dependence upon a total of the power consumption server measurements (114) received from the server monitoring interposers (110) coupled to the power circuit (108); and determine whether the total power consumption of the power circuit (108) exceeds the power capacity, and if the total power consumption of the power circuit (108) exceeds the power capacity, instructing one or more servers (112) to reduce their power consumption.

Also stored in RAM (168) is an operating system (154). Operating systems useful in managing server power consumption in a data center according to embodiments of the present invention include UNIX™, Linux™, Microsoft XP™, AIX™, IBM's i5/OS™, and others as will occur to those of skill in the art. The operating system (154) and the power consumption manager (150) in the example of FIG. 2 are shown in RAM (168), but many components of such software typically are stored in non-volatile memory also, such as, for example, on a disk drive (not shown).

Figure 2:
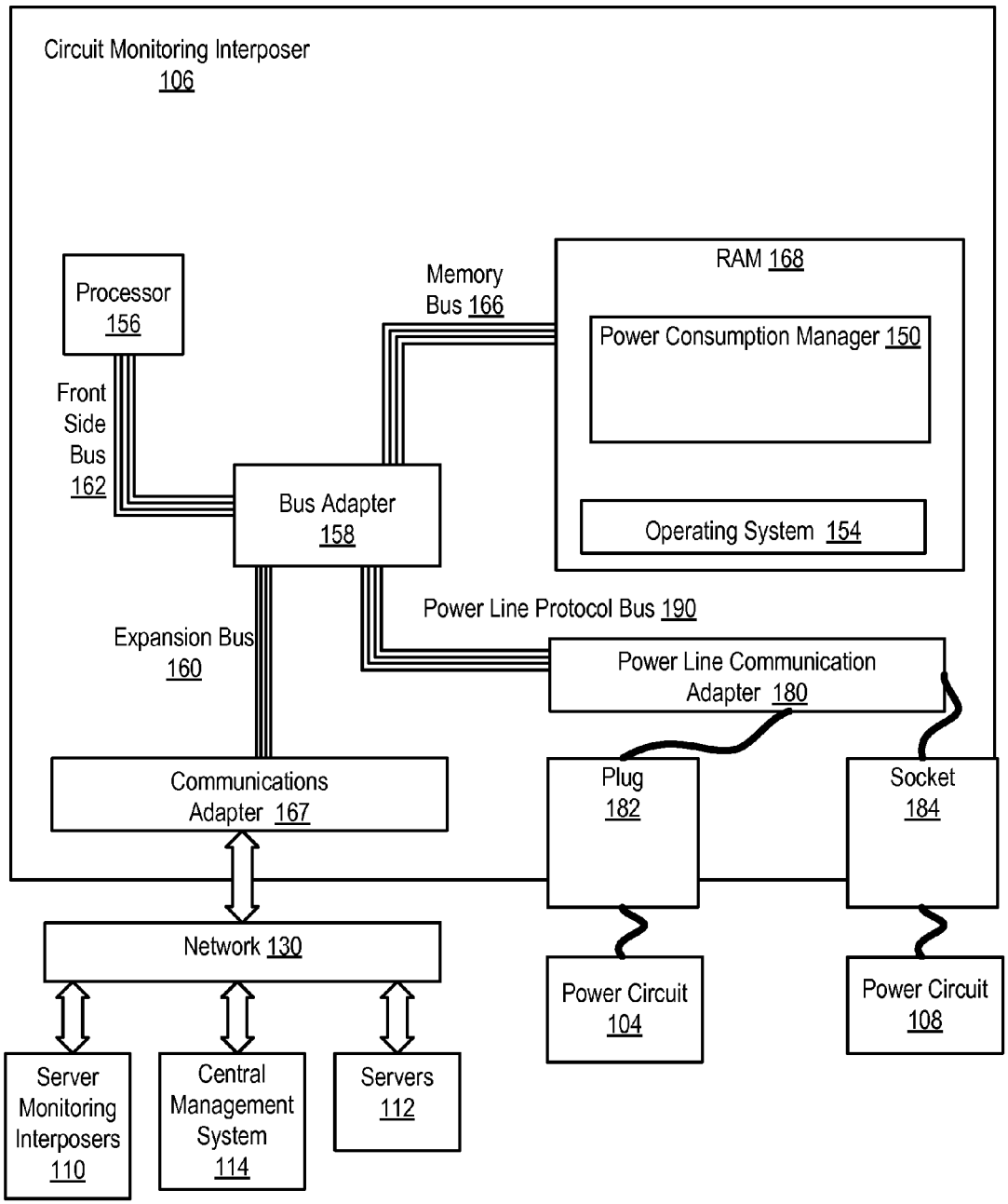
FIG. 2 sets forth a block diagram of automated computing machinery comprising an exemplary circuit monitoring interposer useful in managing power consumption of servers in a data center according to embodiments of the present invention.

The circuit monitoring interposer (106) of FIG. 2 includes a power line communication adapter (180) that is coupled to a plug (182) and a socket (184). The power line communication adapter (180) is coupled to the power line of the power circuit (108) between the plug (182) and the socket (184). The power line communication adapter (180) of FIG. 2 is used to send and receive data communication through the power line of the power circuit (108) and send and receive the data communication to the other components of the circuit monitoring interposer (106) over the power line protocol bus (190). Data communications may include information used for the management of power consumption of the servers, such as an instruction to one or more servers (112) to reduce power consumption, a power consumption server measurement, a total power consumption, or a power capacity of the power circuit (108). The server monitoring interposers (110), the central management system (114), and the servers (112) of FIG. 2 may communicate by a power line communication protocol. In power line communication protocols, the power line is used to transmit data communications from one device to another.

Examples of power line communications protocols useful for managing server power consumption of a data center according to embodiments of the present invention include X10, KNX, INSTEON, BACnet, LonWorks, and HomePlug specifications. The "X-10" means the X-10 protocol. Typical X-10 enabled devices communicate across AC powerline wiring, such as existing AC wiring in a home, using an X-10 transmitter and an X-10 receiver. The X-10 transmitter and the X-10 receiver use Radio Frequency (RF) signals to exchange digital information. The X-10 transmitter and the X-10 receiver communicate with short RF bursts which represent digital information.

In the X-10 protocol, data is sent in data strings called frames. The frame begins with a 4 bit start code designated as "1110." Following the start code, the frame identifies a particular domain, such as house, with a 4 bit "house code," and identifies a device within that domain with a 4 bit "devices code." The frame also includes a command string of 8 bits identifying a particular preset command such as "on," "off," "dim," "bright," "status on," "status off," and "status request."

HomePlug" stands for The HomePlug Powerline Alliance. HomePlug is a not-for-profit corporation formed to provide a forum for the creation of open specifications for high speed home powerline networking products and services. The HomePlug specification is designed for delivery of Internet communications and multimedia to homes through the home power outlet using powerline networking standards.

The HomePlug protocol allows HomePlug-enabled devices to communicate across powerlines using Radio Frequency signals (RF). The HomePlug protocol uses Orthogonal Frequency Division Multiplexing (OFDM) to split the RF signal into multiple smaller sub-signals that are then transmitted from one HomPlug enabled-device to another HomePlug-enabled device at different frequencies across the powerline.

The exemplary circuit monitoring interposer (106) of FIG. 2 includes a communications adapter (167) for data communications with a network (130). Such data communications may be carried out serially through RS-232 connections, through external buses such as a Universal Serial Bus ('USB'), through data communications data communications networks such as IP data communications networks, and in other ways as will occur to those of skill in the art. Communications adapters implement the hardware level of data communications through which one computer sends data communications to another computer, directly or through a data communications network. Examples of communications adapters useful for managing server power consumption in a data center according to embodiments of the present invention include modems for wired dial-up communications, Ethernet (IEEE 802.3) adapters for wired data communications network communications, and 802.11 adapters for wireless data communications network communications.

Figure 3:
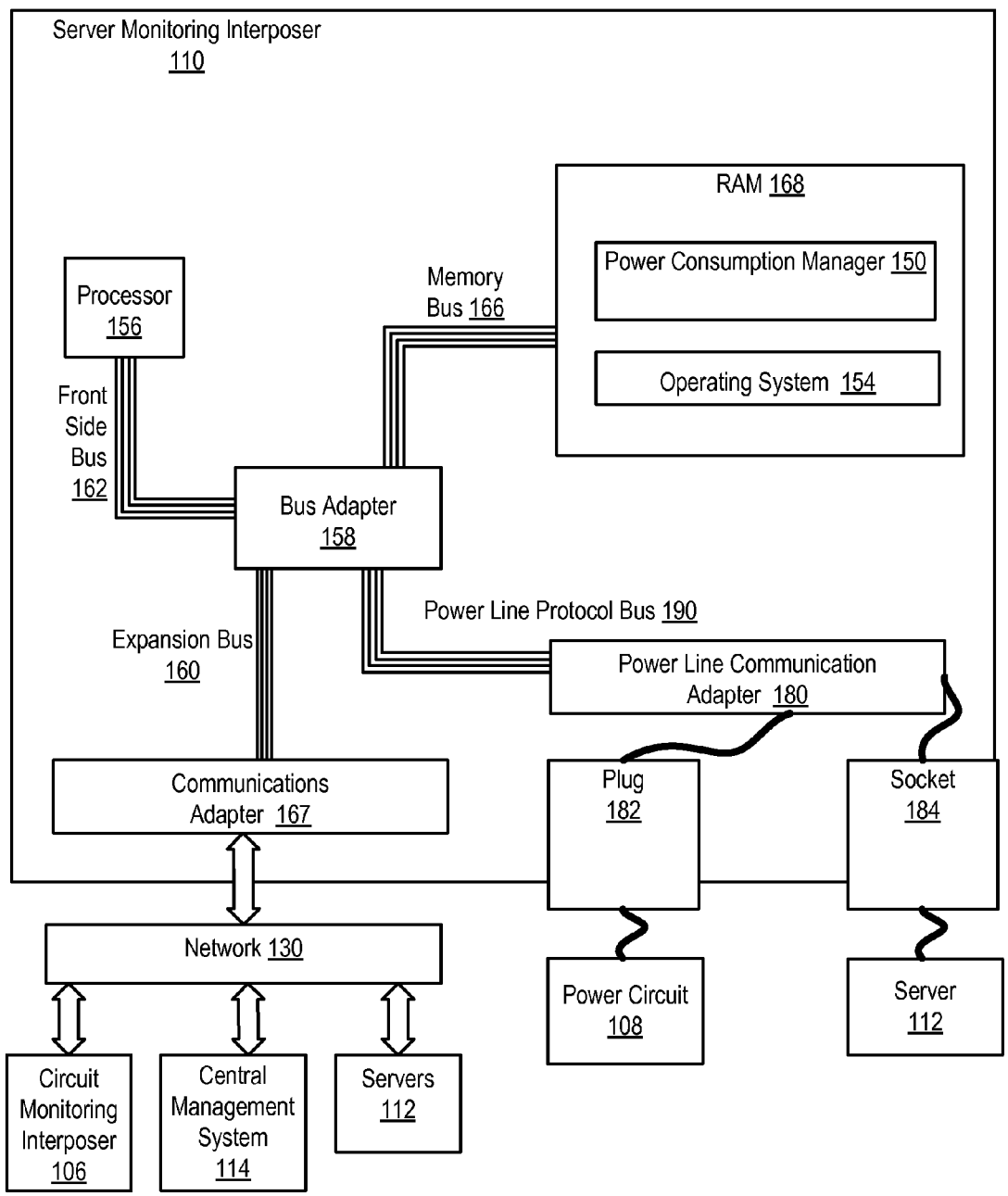
FIG. 3 sets forth a block diagram of automated computing machinery comprising an exemplary server monitoring interposer useful in managing the power consumption of servers in a data center according to embodiments of the present invention.

For further explanation, therefore, FIG. 3 sets forth a block diagram of automated computing machinery comprising an exemplary server monitoring interposer (110) useful in managing the power consumption of servers (112) in a data center according to embodiments of the present invention. The server monitoring interposer (110) of FIG. 3 includes many of the components of the circuit monitoring interposer (106) of FIG. 2. That is, the server monitoring interposer (110) of FIG. 3 includes a processor (156), a bus adapter (158), a front side bus (162), a memory bus (166), a power line protocol bus (190), a power line communication adapter (180), a communications adapter (167), a plug (182), a socket (184), and expansion bus (160), a RAM (168), a power consumption manager (150), and an operation system (154). Stored in the RAM (168) is a power consumption manager (150) that includes computer program instructions for managing server power consumption in a data center in accordance with embodiments of the present invention. In addition to the computer program instructions discussed in FIG. 2 as included in the power consumption manager (150), the power consumption manager (150) of FIG. 3 may also includes computer program instructions that when executed by the processor (156), cause the server monitoring interposer (110) to: monitor the power line of a server 112 to determine a power consumption measurement; transmit the power consumption measurement to the circuit monitoring interposer (106) or the central management system (114); receive an instruction to reduce power consumption at one or more servers (112); transmit an instruction to reduce power consumption at the one or more servers (112). The server monitoring interposer (110) of FIG. 3 uses the communications adapter (167) to transmit data communications, such as power consumption measurements and instructions to reduce power consumption through the network (130) to the circuit monitoring interposer (106), the central management system (114), or the servers (112). The server monitoring interposer (110) of FIG. 3 also uses the power line communication adapter (180) to transmit the data communications through the power line of the server (112).

Figure 4:
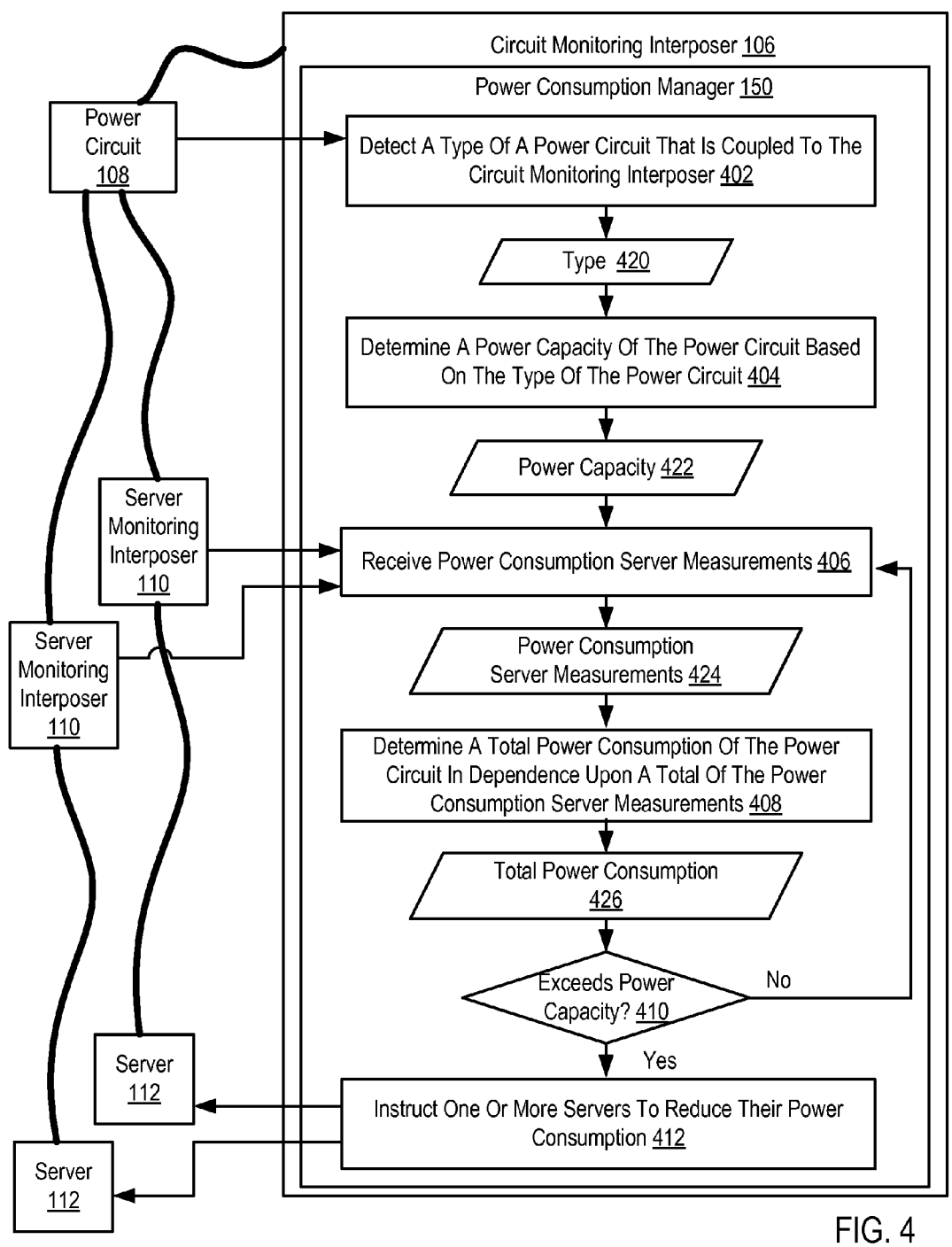
FIG. 4 sets forth a flow chart illustrating an exemplary method for managing server power consumption in a data center according to embodiments of the present invention.

For further explanation, FIG. 4 sets forth a flow chart illustrating an exemplary method for managing server power consumption in a data center according to embodiments of the present invention. The method of FIG. 4 includes detecting (402), by a circuit monitoring interposer (106), a type (420) of a power circuit (108) that is currently coupled to the circuit monitoring interposer (106). Detecting (402) the type (420) of the power circuit (108) may be carried out by use of circuitry within the circuit monitoring interposer (106) and the power manager (150). The type (420) of the power circuit (108) of FIG. 4 may include a voltage rating, such as a 120 volt type or a 240 volt type.

The method of FIG. 4 includes determining (404) a power capacity (422) of the power circuit (108) based on the type (420) of the power circuit (108). The power capacity (422) may be a predetermined threshold established by a system administrator of the data center (100) of FIG. 1 to meet power objectives of the data center (100). In such embodiments, determining (404) a power capacity (422) of the power circuit (108) based on the type (420) of the power circuit (108) may be carried out by retrieving the predetermined threshold from a well known location in data storage.

The method of FIG. 4 includes receiving (406) a power consumption server measurement (424) from each server monitoring interposer (110) of a plurality of server monitoring interposers, each power consumption server measurement (424) corresponding to a server (112) of the plurality of servers. The power consumption server measurement (424) is a value representing the amount of power that a server (112) is consuming or is predicted or estimated to consume. The power consumption server measurements (424) may be received from the server monitoring interposers (110) wirelessly or through a power line or a dedicated data communication wire.

The method of FIG. 4 includes determining (408) a total (426) power consumption (426) of the power circuit (108) in dependence upon a total of the power consumption server measurements (424) received from the plurality of server monitoring interposers (110) coupled to the power circuit (108). Determining (408) a total power consumption (426) may be carried out by adding each power consumption server measurement (424) received from each server monitoring interposer (110).

The method of FIG. 4 includes determining (410) whether the total power consumption (426) of the power circuit (108) exceeds the power capacity (422). Determining (410) whether the total power consumption (426) exceeds the power capacity (422) may be carried out by comparing the total power consumption (426) with the power capacity (422).

If the total power consumption (426) does not exceed the power capacity (422) of the power circuit (108), the method of FIG. 4 continues to receive (406) power consumption server measurements (424) and determine (408) the total power consumption (426) until the circuit monitoring interposer (106) determines (410) that the total power consumption (426) exceeds the power capacity (422). If the total power consumption (426) exceeds the power capacity (422), the method of FIG. 4 includes instructing (412) one or more servers (112) to reduce their power consumption. Instructing (412) the one or more servers (112) to reduce their power consumption may include the circuit monitoring interposer (106) transmitting a message to the one or more servers (112) wirelessly or through the power lines or a dedicated data communications wire.

Figure 5:
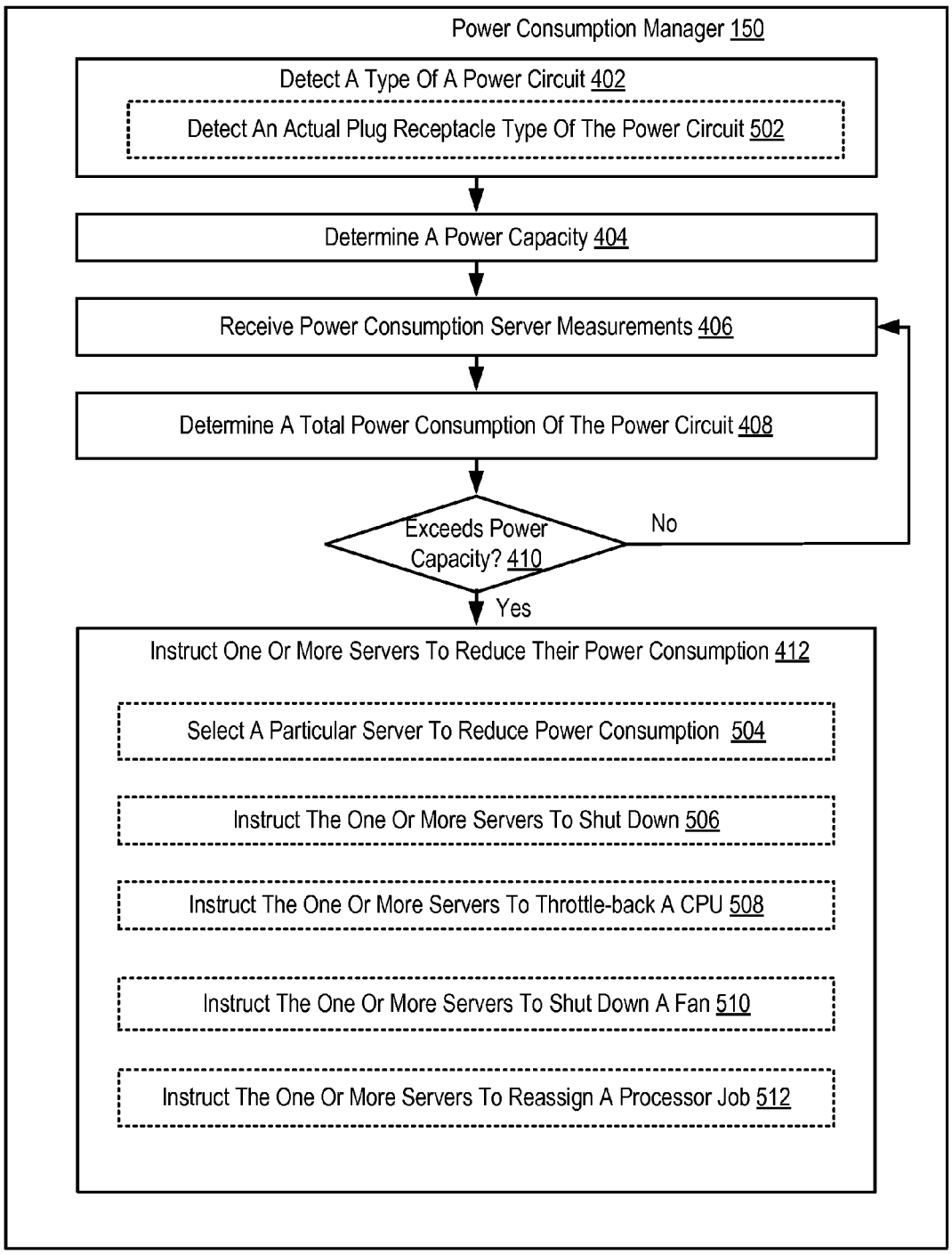
FIG. 5 sets forth a flow chart illustrating an exemplary method for managing server power consumption in a data center according to embodiments of the present invention.

For further explanation, FIG. 5 sets forth a flow chart illustrating an exemplary method for managing server power consumption in a data center according to embodiments of the present invention. The method of FIG. 5, is similar to the method of FIG. 4 in that the method of FIG. 5 includes detecting (402) the type of the power circuit; determining (404) a power capacity; receiving (406) power consumption server measurements; determining (408) a total power consumption; determining (410) whether the total power consumption exceeds the power capacity and if the total power consumption exceeds the power capacity, instructing (412) one or more servers to reduce their power consumption.

In the method of FIG. 5 detecting (402) the type of the power circuit includes detecting (502) an actual plug receptacle type of the power circuit. The circuit monitoring interposer (106) may include circuitry that determines the actual plug receptacle type of the power circuit (104) or the power manager (150) may use software logic to detect the actual plug receptacle type based on electrical connections and information received from the power line communications adapter (180) of FIG. 2. The power consumption manager (150) may determine that the plug receptacles of the power circuit are a type that is rated for 30 Amperes in the 100-120V range. For example, the power consumption manager (150) may determine that a plug is a NEMA 5-15 or a NEMA 5-20 plug. Based on the determination of the current rating, the power consumption manager (150) determines the voltage rating and the type of the power circuit. The power consumption manager (150) may also correlate the type of the plug with a type of the connected power distribution unit.

The example of FIG. 5 also includes a number of alternative ways of instructing (412) the one or more servers to reduce their power consumption. Instructing (412) the one or more servers to reduce their power consumption according to the method of FIG. 5 may include selecting (504) a particular server to reduce power consumption in dependence upon the power consumption server measurement of the particular server. Selecting (504) a particular server to reduce power consumption in dependence upon the power consumption server measurement of the particular server may be carried out by comparing the power consumption server measurement of that particular server to the other power consumption server measurements corresponding to the other servers.

Instructing (412) the one or more servers to reduce their power consumption according to the method of FIG. 5 may include instructing (506) the one or more servers to shut down. Instructing (506) the one or more severs to shut down may be carried out by transmitting a message to the one or more servers through the central management system (114) of FIG. 1.

Instructing (412) the one or more servers to reduce their power consumption according to the method of FIG. 5 may include instructing (508) the one or more servers to throttle-down a CPU of the one or more servers. Throttling-down a CPU may be carried out by reducing the data communications bus clock speed of one or more of the selected servers. Data communications bus clock speeds that may be reduced to throttle-down the selected servers include I/O bus clock speeds, memory bus clock speeds, and so on as will occur to those of skill in the art. The power consumption manager may continue to instruct one or more servers to throttle-down until the total power consumption of the power circuit is reduced below the power capacity of the power circuit.

Instructing (412) the one or more servers to reduce their power consumption according to the method of FIG. 5 may include instructing (510) the one or more servers to shut down a fan within the one or more servers. Instructing the one or more servers to shut down a fan may be carried out by sending a message to a particular server that is operating a fan at a speed that is above a particular threshold.

Instructing (412) the one or more servers to reduce their power consumption according to the method of FIG. 5 may include instructing (512) the one or more servers to reassign a processor job to another server. Instructing the one or more servers to reassign a processor job to another server may be carried out by sending a message to the central management system (114) of FIG. 1 to re-assign processor jobs between the plurality of servers (112) to enable one or more of the servers to reduce their power consumption.

Alternatively to reassigning a processor job, the power consumption manager (150) may examine jobs in a job queue to determine the power impact of the job before the job is assigned. Based on the determination of the power impact of the job, the job may be assigned to a server (112) that can handle the additional power consumption. By assigning jobs based on power consumption determinations, the power consumption of the servers (112) may be managed efficiently by the power consumption manager (150).

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of monitoring power consumption, the method comprising:
   determining, by a circuit monitoring interposer, a power capacity of a power circuit based on a type of the power circuit, wherein the circuit monitoring interposer comprises a device that provides an electrical contact between the power circuit and a power supply;
   receiving, by the circuit monitoring interposer, a power consumption server measurement from each server monitoring interposer of a plurality of server monitoring interposers, each power consumption server measurement corresponding to a server of the plurality of servers, wherein a server monitoring interposer comprises a device that provides an electrical contact between the power circuit and a server;
   determining a total power consumption of the power circuit in dependence upon a total of the power consumption server measurements received from the server monitoring interposers coupled to the power circuit; and
   determining whether the total power consumption of the power circuit exceeds the power capacity of the power circuit, and if the total power consumption of the power circuit exceeds the power capacity, instructing, by the circuit monitoring interposer, one or more servers to reduce their power consumption.

2. The method of claim 1, further comprising detecting, by the circuit monitoring interposer, the type of the power circuit that is currently coupled to the circuit monitoring interposer including detecting an actual plug receptacle type of the power circuit.

3. The method of claim 1, wherein instructing the one or more servers to reduce their power consumption includes selecting a particular server to reduce power consumption in dependence upon the power consumption server measurement of the particular server.

4. The method of claim 1, wherein instructing the one or more servers to reduce their power consumption includes instructing the one or more servers to throttle-down a CPU of the one or more servers.

5. The method of claim 1, wherein instructing the one or more servers to reduce their power consumption includes instructing the one or more servers to shut down a fan within the one or more servers.

6. The method of claim 1, wherein instructing the one or more servers to reduce their power consumption includes instructing the one or more servers to reassign a processor job to another server.

7. The method of claim 1, wherein instructing the one or more servers to reduce their power consumption includes instructing the one or more servers to shut down.

8. The method of claim 1, wherein the instruction to reduce the power consumption of the particular sever is transmitted wirelessly to the server.

9. A system comprising:
a circuit monitoring interposer to:
determine, by a circuit monitoring interposer, a power capacity of a power circuit based on a type of the power circuit, wherein the circuit monitoring interposer comprises a device that provides an electrical contact between the power circuit and a power supply;
receive, by the circuit monitoring interposer, a power consumption server measurement from each server monitoring interposer of a plurality of server monitoring interposers, each power consumption server measurement corresponding to a server of the plurality of servers, wherein a server monitoring interposer comprises a device that provides an electrical contact between the power circuit and a server;
determine a total power consumption of the power circuit in dependence upon a total of the power consumption server measurements received from the server monitoring interposers coupled to the power circuit; and
determine whether the total power consumption of the power circuit exceeds the power capacity of the power circuit, and if the total power consumption of the power circuit exceeds the power capacity, instructing, by the circuit monitoring interposer, one or more servers to reduce their power consumption.

10. The system of claim 9, wherein instructing the one or more servers to reduce their power consumption includes selecting a particular server to reduce power consumption in dependence upon the power consumption server measurement of the particular server.

11. The system of claim 9, wherein instructing the one or more servers to reduce their power consumption includes instructing the one or more servers to throttle-down a CPU of the one or more servers.

12. The system of claim 9, wherein instructing the one or more servers to reduce their power consumption includes instructing the one or more servers to shut down a fan within the one or more server.

13. The system of claim 9, wherein instructing the one or more servers to reduce their power consumption includes instructing the one or more servers to reassign a processor job to another server.

14. The system of claim 9, wherein instructing the one or more servers to reduce their power consumption includes instructing the one or more servers to shut down.

15. The system of claim 9, wherein the instruction to reduce the power consumption of the particular sever is transmitted through a wire link coupled to the circuit monitoring interposer.

16. A computer program product for signaling completion of a message transfer from an origin compute node to a target compute node, the computer program product disposed upon a computer readable storage medium, the computer program product comprising computer program instructions capable of:
determining, by a circuit monitoring interposer, a power capacity of a power circuit based on a type of the power circuit, wherein the circuit monitoring interposer comprises a device that provides an electrical contact between the power circuit and a power supply;
receiving, by the circuit monitoring interposer, a power consumption server measurement from each server monitoring interposer of a plurality of server monitoring interposers, each power consumption server measurement corresponding to a server of the plurality of servers, wherein a server monitoring interposer comprises a device that provides an electrical contact between the power circuit and a server;
determining a total power consumption of the power circuit in dependence upon a total of the power consumption server measurements received from the server monitoring interposers coupled to the power circuit; and
determining whether the total power consumption of the power circuit exceeds the power capacity of the power circuit, and if the total power consumption of the power circuit exceeds the power capacity, instructing, by the circuit monitoring interposer, one or more servers to reduce their power consumption.

17. The computer program product of claim 16, wherein instructing the one or more servers to reduce their power consumption includes selecting a particular server to reduce power consumption in dependence upon the power consumption server measurement of the particular server.

18. The computer program product of claim 16, wherein instructing the one or more servers to reduce their power consumption includes instructing the one or more servers to throttle-down a CPU of the one or more servers.

19. The computer program product of claim 16, wherein instructing the one or more servers to reduce their power consumption includes instructing the one or more servers to shut down a fan within the one or more server.

20. The computer program product of claim 16, wherein instructing the one or more servers to reduce their power consumption includes instructing the one or more servers to reassign a processor job to another server.

* * * * *